United States Patent [19]
Bickley et al.

[11] 4,283,723
[45] Aug. 11, 1981

[54] APPARATUS AND METHOD FOR PROVIDING DIGITAL AND/OR BAR GRAPH DISPLAYS OF MEASURED QUANTITIES

[75] Inventors: Robert H. Bickley, Scottsdale; Thad J. Genrich, Tempe, both of Ariz.

[73] Assignee: Motorola Inc., Schaumburg, Ill.

[21] Appl. No.: 42,735

[22] Filed: May 29, 1979

[51] Int. Cl.$^3$ .............................................. G06F 3/14
[52] U.S. Cl. ................................. 340/722; 283/1 R; 340/723; 340/735; 340/750
[58] Field of Search ............... 283/1 R; 340/722, 709, 340/723, 790, 735, 744, 748, 750

[56] References Cited
U.S. PATENT DOCUMENTS

| | | | |
|---|---|---|---|
| 3,343,030 | 9/1967 | Dragon et al. | 340/722 |
| 3,678,498 | 7/1972 | Nagamatsu et al. | 340/722 |
| 3,778,811 | 12/1973 | Gicca et al. | 340/722 |
| 3,781,850 | 12/1973 | Gicca et al. | 340/722 |
| 3,868,673 | 2/1975 | Mau, Jr. et al. | 340/723 |
| 3,893,100 | 7/1975 | Stein | 340/731 |
| 3,991,868 | 11/1976 | Robinson et al. | 340/731 |

Primary Examiner—Marshall M. Curtis

[57] ABSTRACT

A font of characters including a first set defined by dots and a second set outlined by dots and used as a cursor, and a plurality of characters each forming a line segment and combinable in differing quantities and types to form a bar graph presentation, measured characteristics being displayed by digital and bar graph presentations simultaneously and the bar graphs being variable in either or both directions from a reference point such as zero.

10 Claims, 6 Drawing Figures

APPARATUS AND METHOD FOR PROVIDING DIGITAL AND/OR BAR GRAPH DISPLAYS OF MEASURED QUANTITIES

BACKGROUND OF THE INVENTION

In prior art display devices the common method of displaying measured characteristics, such as voltage, power, etc., is to provide electromechanical meters or fluid gages. In general, the electromechanical meters provide the required resolution but they can be easily misinterpreted and are relatively complex and bulky. For example, it is common to use a single meter movement for a variety of scales by incorporating shunt and series resistors and other components, along with switches and the like. The operator must then determine the position of the meter, note the particular scale at which the device is set and make minor calculations to determine the actual value of the measured characteristic. Thus, there is much room for errors in reading or in the minor calculations if the operator is under stress or in a hurry. Further, the electromechanical meters are generally relatively fragile and limited in their use.

In recent years some attempts have been made at displaying some measured characteristics in a visual format. One of the most common is a digital display, such as digital volt meters and the like wherein the measurement is converted directly to a digital reading. Again, these devices are relatively limited in their application.

Some work has also been done in utilizing bar graph presentations on cathode ray type displays. These presentations have generally been limited to hystogram type presentations. Some limited bar graph presentations have been utilized wherein most of the information is permanently displayed on the face of a cathode ray tube or the like and some form of line is generated to indicate the measured characteristic (i.e., amplitude). These devices have all of the limitations of electromechanical meters, since they are very limited in application.

SUMMARY OF THE INVENTION

The present invention pertains to apparatus and methods for providing a cathode ray tube type of display wherein measured characteristics are displayed digitally and in bar graph form by utilizing a font of characters including a plurlity of characters forming line segments different in length than each of the other characters and combinable in differing quantities and types to form bar graph presentations of substantially any desired length and varying in either direction from a reference, the font of characters further includes a first set of numbers defined by dots and a second set of numbers outlined by dots, which second set of numbers are utilized as a cursor.

It is an object of the present invention to provide new and improved methods and apparatus used in producing cathode ray tube type of displays for measured characteristics.

It is a further object of the present invention to provide new and improved method and apparatus for producing cathode ray tube type of displays incorporating a novel font of characters.

It is a further object of the present invention to provide a novel font of characters combinable in differing quantities and types to form bar graph presentations of substantially any desired length and direction.

These and other objects of this invention will become apparent to those skilled in the art on consideration of the accompanying specification, claims and drawings.

BRIEF DESCRIPTION OF THE DRAWINGS

Referring to the drawings:

FIG. 2, including 2A and 2B, illustrates a font of alphanumeric characters:

FIG. 3, including 3A and 3B, illustrates a font of characters for producing bar graph presentations.

DESCRIPTION OF THE PREFERRED EMBODIMENT

Figure 1:
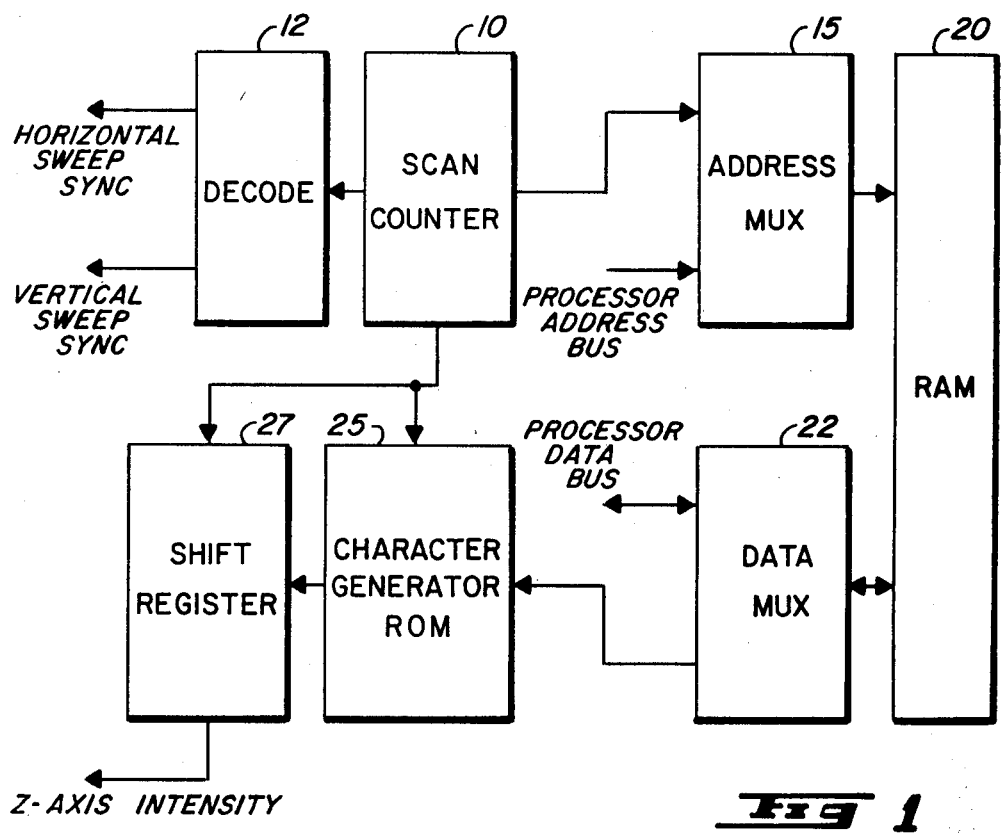
FIG. 1 is a simplified block diagram of the apparatus used in generating a cathode ray tube type of display.

Referring specifically to FIG. 1, a scan counter designated 10 is generally a standard counter having one or more desired outputs which are synchronized or in some way related, e.g., multiple frequencies. The scan counter 10 provides an output to a decode circuit 12, which in this embodiment is essentially a ramp generator constructed to be reset periodically by a given number of counts from the scan counter 10. The decode circuit 12 provides horizontal and vertical sweep signals which produce a raster on the front of a cathode ray tube, in a manner well known to those skilled in the art. Thus, the scan counter 10 is essentially synchronized with the sweeping of the cathode ray tube.

The scan counter 10 also provides an output to a block designated address mux 15. The address mux 15 also receives address information from a processor on a processor address bus. Because the processor is a well known and relatively complex device and because the processor does not form a part of this invention, only an input from the address bus is illustrated. An output of the address mux 15 is connected to an input of a random access memory (RAM) 20. The processor also supplies data, which consists of a selection of specific characters representative of predetermined information and measured characteristics to be displayed on the cathode ray tube, to a data mux 22 on a processor data bus. Data is also supplied to the processor from the data mux 22 on the processor data bus. The data mux 22 has an output connected to the RAM 20 and the RAM 20 has an output connected through the data mux 22 to a character generator read only memory (ROM) 25. The ROM 25 has a font of characters stored therein which will be described in detail in conjunction with FIGS. 2 and 3. The output of the ROM 25 is supplied to a shift register 27 and both the ROM 25 and shift register 27 are synchronized by counter outputs from the scan counter 10. The output of the shift register 27 controls the intensity of the Z axis of the cathode ray tube.

In the operation of the circuit described in FIG. 1, the processor controls the address mux 15 and data mux 22 so that when information is generated to be written in the RAM 20 the normal operation of the circuit is switched and address and data information are applied through the mux 15 and mux 22 to the RAM 20. The data information is written into the RAM 20 at the correct address so that it will appear in the correct position of the display on the face of the cathode ray tube. With the address and data information written into the RAM 20 the processor returns the address mux 15 and data mux 22 to the normal operation. In the normal operation the scan counter 10 scans the RAM 20 through the address mux 15 and as the various positions of information written into the RAM 20 are contacted this information is supplied through the data mux 22 to the ROM 25. In the ROM 25 the correct character is selected to represent the desired information and the scan counter 10 shifts the character into the shift register 27. In the present embodiment each of the characters is composed of 8 rows of 8 bits of information so that 8 bits of information from a specific character must be shifted into the register 27 for each of 8 consecutive horizontal scans. The 8 bits of information in the shift register 27 must then be shifted out of the register to control the Z axis intensity at the correct time during the horizontal scan to cause the character to appear at the correct horizontal position on the face of the cathode ray tube.

While other types of cathode ray tube controllers are available, notably an IC chip designated MC6845 manufactured by Motorola Inc. and an IC chip designated 8275 manufactured by INTEL Corporation, either of which might be utilized to replace the circuitry of FIG. 1, it is believed that the multiplexing of the address and data information in the manner described to utilize a single RAM simplifies and improves the circuitry.

Figures 2A, 3A:
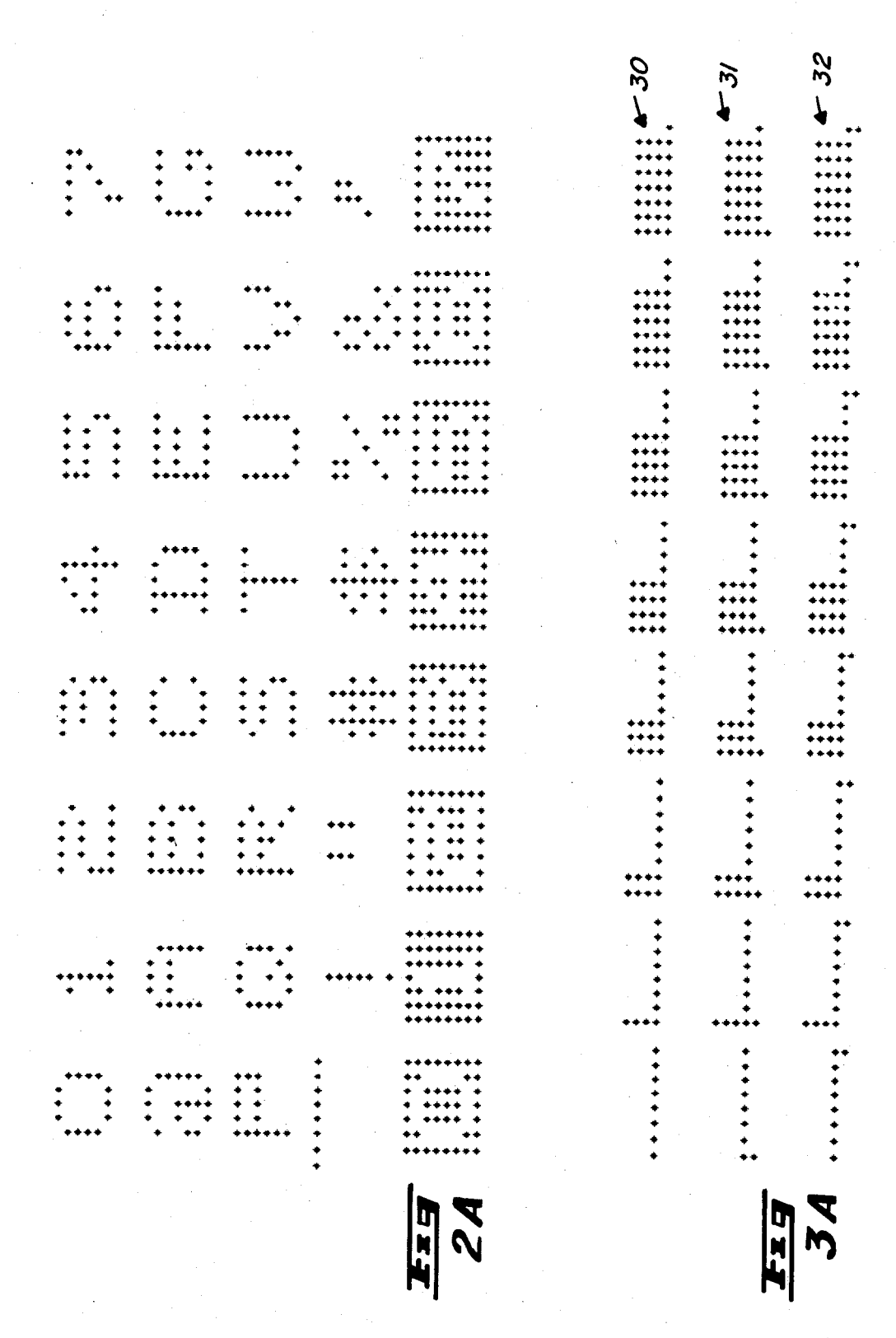
Figures 2B, 3B:
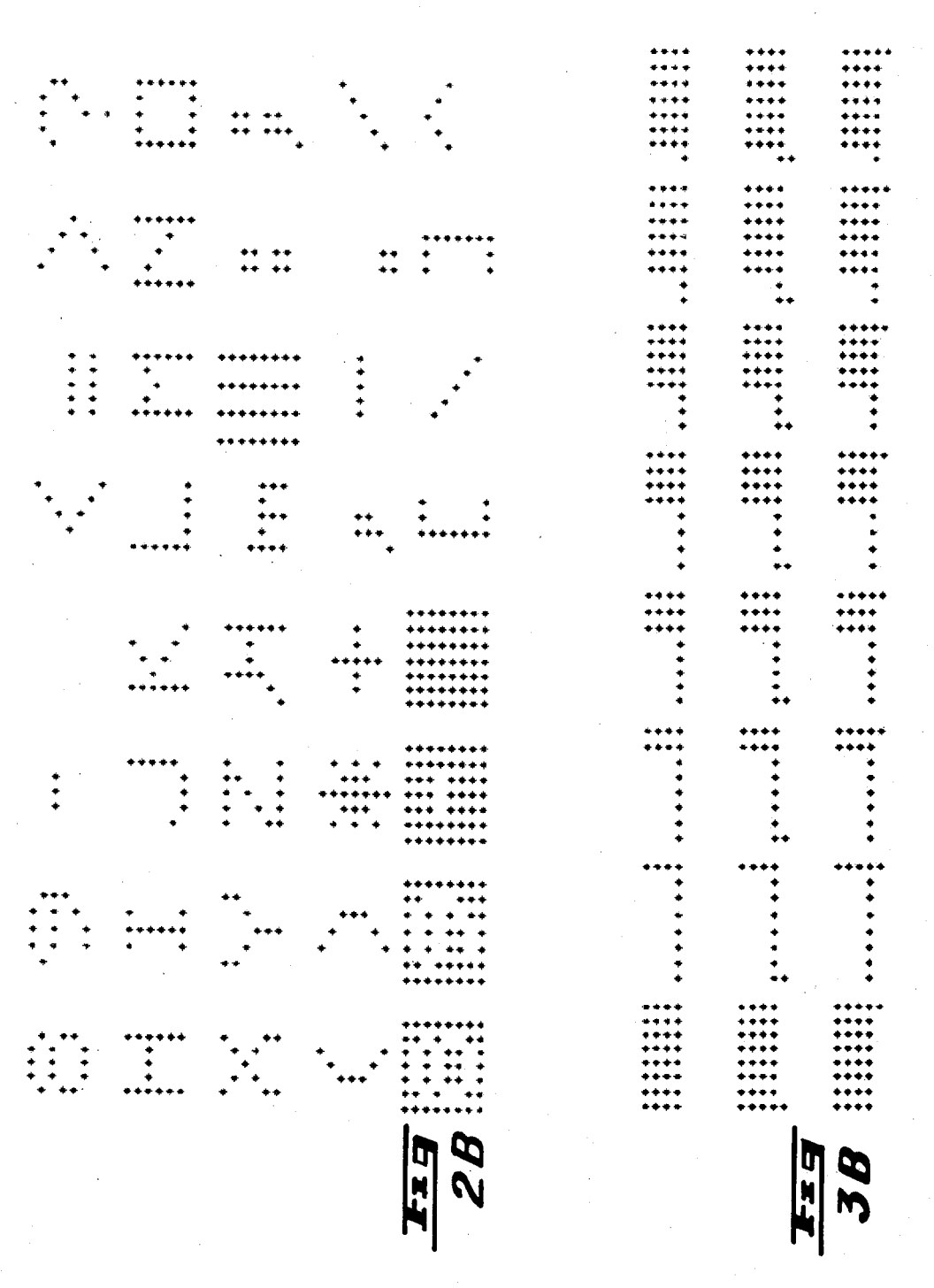

FIG. 2 illustrates a font of alphanumeric characters including various additional symbols required in standard visual presentations. The characters of FIG. 2 are represented by a plurality of dots prepositioned in rows and columns with each dot representing a bright spot on the face of the cathode ray tube. A first set of numerals, the alphabet and the various other symbols are represented by a plurality of dots positioned to form the body of the numeral, alphabet or symbol. A second set of numerals is formed by a plurality of dots outlining the body of each of the numerals. Thus, the numerals in the second set are essentially the negative of the numeral in the first set. In the present embodiment eight rows and eight columns of dots are utilized for each character and the dots, or activated spots on the face of the cathode ray tube, for the first set of numerals are the exact opposite of the dots in the second set of numerals. For example, the numeral 0 in the first set is represented or defined by 14 dots with the remaining 50 dots inactive. The numeral 0 in the second set is defined by activating 42 of the 64 dots (one vertical column of 8 dots is always deactivated in the alphanumerics) with only the 14 positions which are activated in the first set being deactivated in the second set. The second set of numerals is utilized as a cursor and any character from the second set may be selected to replace the equivalent numeral from the first set as a cursor. The cursor, of course, is operable manually from a front panel in a manner well known to those skilled in the art.

Referring specifically to FIG. 3, a font of characters is illustrated which are utilized in combination to form bar graph presentations. Each of the characters is again formed with an 8×8 matrix of dots, but only four rows of dots are utilized in this embodiment so that the bar graph is approximately one-half the height of the alphanumerics. Three rows, 30, 31 and 32 of 16 characters each are illustrated in FIG. 3 and when referring to the characters in the present disclosure they will be designated 1 through 16 beginning at the left of the row. In each of the characters the first row of dots is always complete and when combined with other characters will form a reference line. The characters in rows 31 and 32 have an additional dot positioned below the reference line, which additional dots forms a graduation along the reference line. The graduations of the characters in row 31 are positioned at the left edge of the character while the graduations in the characters of row 32 are positioned at the right edge of the characters to provide greater flexibility and application. In each of the rows of characters 30, 31 and 32, the first character is a single row of dots representing a segment of the reference line. The second character has a single row of dots with a single column of dots at the left edge thereof (left justified). Each additional character 3 through 9 has an additional row of dots added thereto until all of the rows are complete in the 9th character. The 10th character has a single row of dots at the right edge thereof and an additional row of dots is added for each of the characters 11 through 16 (right justified). In each row 30, 31 and 32, the characters 10 through 16 are a mirror image of the characters 2 through 8, respectively (except for the graduating dots). Thus, differing quantities and characters from the rows 30, 31 and 32 can be combined to form bar graph presentations extending in either direction from a central 0 reference or from the right or left edge and in substantially any desired length. While the font of characters illustrated in FIG. 3 can be utilized to produce substantially any desired horizontal bar graph, it will be understood by those skilled in the art that a similar font of characters oriented perpendicular to the illustrated font might be utilized to produce substantially any desired vertical bar graph. Further, while the rows are referred to as horizontal dots and the columns are formed by vertical groups of dots, it should be understood that these terms may be interchanged for each individual character.

Figure 4:
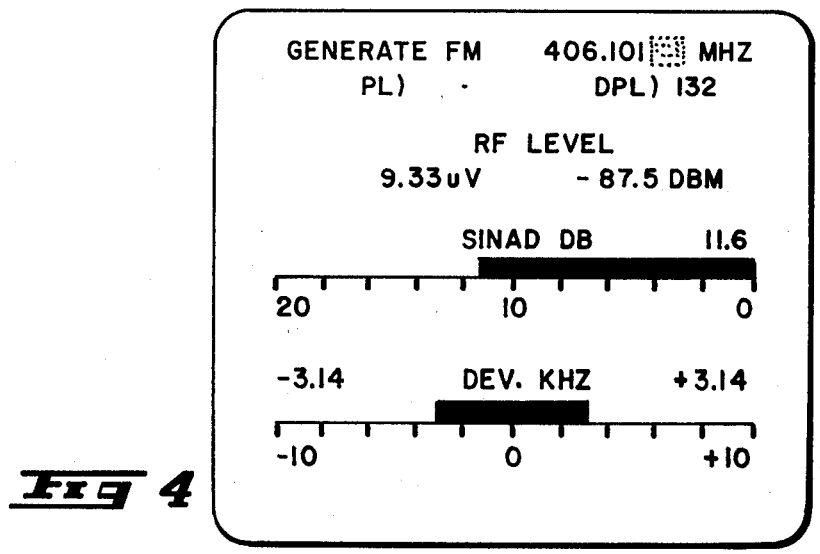
FIG. 4 is a representation of a typical cathode ray tube type of display incorporating the present invention.

Referring to the cathode ray tube display of FIG. 4, a typical presentation utilizing the font of characters in FIGS. 2 and 3 is illustrated. Referring specifically to the upper line of FIG. 4, the left side indicates that an FM signal is being generated and the right side indicates the selected signal is at 406.1012 megahertz. For purposes of illustration, the final 2 in the frequency number is illustrated in the cursor form of digit. Generally, the apparatus will be designed so that the cursor is moveable in a horizontal or vertical direction and the specific number on which the cursor is set can be altered by means of a keyboard or other selection device. The second line provides an indication as to whether a "private line" (PL) or a "digital private line" (DPL) type of code is being utilized. In the illustration a "digital private line" code number 132 is being used. The next line specifies "RF level" and the line immediately therebelow provides an indication of the level of RF being generated, in this illustration 9.33 microvolts or −87.5 dbm. All of the above described alphanumerics, including the symbols used therewith, are generated from the font of characters stored in ROM 25 and illustrated in FIGS. 2 and 3. It will be understood by those skilled in the art that substantially any format might be utilized and that the presentation described is simply for purposes of this explanation.

A first bar graph is illustrated generally in the middle of the presentation and is labeled Sinad db. As is well known in the art, the sinad measurement is an indication of the merit of the receiver. The bar graph of FIG. 4 extends from 0 to 20 db and the reading illustrated is 11.60 db which reading is illustrated graphically as well as in digital form at the right hand edge of the graph. A second bar graph is illustrated near the bottom of the presentation and this graph provides an indication of the deviation, in kilohertz, of the generated FM signal above and below zero. The deviation above and below zero is illustrated digitally at each side of the graph, as well as graphically. The characters of FIG. 3 are utilized to generate the bar graphs illustrated in FIG. 4. Three characters are utilized between each graduation of the graphs in the present embodiment, but it should be understood that more or less characters might be utilized if desired.

The deviation bar graph of FIG. 4 can best be used to explain the use of the characters of FIG. 3. The characters may be combined in a variety of ways, but one possible way is as follows. Each of the graduations on the deviation bar graph is 2 kilohertz. To produce the reference line at the left of the graph, from −10 kilohertz to −8 kilohertz, the first character in row 31 of FIG. 3 and two of the first characters from row 30 are utilized. Of course, it will be obvious that this graduation can also be constructed by utilizing the first character in row 31, the first character in row 30 and the first character in row 32. In a similar fashion the second and third graduations of the reference line can be generated. The fourth graduation (−2 to −4 kilohertz) is produced by utilizing the first character in row 31 of FIG. 3, the 15th character in row 30 and the 9th character in row 32. The fifth graduation (0 to −2 kilohertz) is produced by utilizing the 9th character in row 30 twice and the ninth character in row 32 once. Similarly the sixth graduation is produced by utilizing the 9th character in row 30 twice and the 9th character in row 32 once. The seventh graduation (2 to 4 kilohertz) is produced by utilizing the 9th character in row 30, the 7th character in row 30 and the 1st character in row 32. From this exemplary description, it can be seen that substantially any length of bar graph can be produced with good accuracy and, if greater accuracy is required, additional characters can be utilized in each graduation.

Thus, an improved cathode ray tube type of display and apparatus for producing the display are illustrated and described. Some of the advantages realized by utilizing the present display are increased reliability and ruggedness, no mechanical calibration or moving parts, a wide variety of meter formats with electronic damping, averaging and peak hold available. Further, the use of the simultaneous graph and digital presentation greatly simplifies the meter reading and increases the accuracy and ease of use. Errors due to incorrect addition, incorrect dbm-volts conversion and interpolation or paralax are completely removed. While each of the characters in the font are defined with an 8×8 matrix of dots, it will be understood by those skilled in the art, that substantially any size of matrix might be utilized if desired and, different matrices might be utilized for different characters if desired. While we have shown and described a specific embodiment of this invention, further modifications and improvements will occur to those skilled in the art. We desire it to be understood, therefore, that this invention is not limited to the particular form shown and we intend in the appended claims to cover all modifications which do not depart from the spirit and scope of this invention.

We claim:

1. Display apparatus for producing a variable bar graph presentation on a cathode ray tube type of display, including generating means for selectively providing a plurality of characters each composed of a plurality of dots prepositioned in rows and columns to form a line segment different in length than each of the other characters, and means for combining said characters in differing quantities and types to form bar graph presentations of substantially any desired length.

2. Display apparatus as claimed in claim 1 including the generating means providing two sets of mirror image characters justified from opposite ends and combinable to form bar graph presentations of substantially any desired length in opposite directions from a reference value.

3. Display apparatus as claimed in claim 1 including the generating means providing additional dots positioned transversely from each line segment to form graduations for measurements.

4. Display apparatus as claimed in claim 1 including the generating means providing each character with a single complete row of dots situated to form a continuous reference line in conjunction with other characters.

5. Display apparatus as claimed in claim 4 including the generating means forming each character from a plurality of rows of dots in addition to the single row and each successive character having one less dot in each of the plurality of rows, said characters varying from all of the plurality of rows being full of dots to all of the plurality of rows being void of dots.

6. A cathode ray tube type of display connected to receive a variety of measured characteristics, said display comprising:
   (a) storage means for selectively providing, upon command, any of a font of characters including alpha-numerics and a plurality of characters each composed of a plurality of dots prepositioned in rows and columns to form a line segment different in length than each of the other characters, said plurality of characters being combinable in differing quantities and types to form bar graph presentations of substantially any desired length; and
   (b) apparatus connected to said storing means for commanding the selection of alpha-numerics and some of the plurality of characters to visually display the measured characteristics graphically and digitally simultaneously.

7. A cathode ray tube type of display as claimed in claim 6 wherein the alpha-numerics include characters each composed of a plurality of dots prepositioned in rows and columns to form a first set of numerals with the dots forming the body of each numeral and a second set of numerals with the dots outlining the body of each numeral.

8. A method of producing a cathode ray tube type of display for a measured characteristic comprising the steps of:
   (a) storing in a memory a font of characters including a plurality of characters each composed of a plurality of dots prepositioned in rows and columns to form a line segment different in length than each of the other characters,
   (b) selecting differing quantities and types of the plurality of characters; and
   (c) combining the selected quantities and types to form a bar graph presentation representative of the measured characteristics.

9. A method as claimed in claim 8 wherein the font of characters include alpha-numerics and the selecting step includes selecting a digital representation of the measured characteristic.

10. A method as claimed in claim 9 wherein the measured characteristic varies positively and negatively about a reference value and the step of combining includes forming a bar graph presentation representative of the measured characteristic in both directions from the reference value.

* * * * *